(12) United States Patent
Ho et al.

(10) Patent No.: US 6,449,169 B1
(45) Date of Patent: Sep. 10, 2002

(54) BALL GRID ARRAY PACKAGE WITH INTERDIGITATED POWER RING AND GROUND RING

(75) Inventors: Tzong-Da Ho, Taichung; Chih-Chin Liao, Yuanlin; Chien-Te Chen, Fengyuan, all of (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 0 days.

(21) Appl. No.: 09/796,316

(22) Filed: Feb. 28, 2001

(51) Int. Cl.[7] .................................................. H05K 1/18
(52) U.S. Cl. ........................ 361/762; 361/780; 361/767
(58) Field of Search ........................ 174/261; 361/767, 361/783, 777, 780, 260; 257/691, 698, 786, 784

(56) References Cited

U.S. PATENT DOCUMENTS

| | | | | |
|---|---|---|---|---|
| 4,513,355 A | * | 4/1985 | Schroeder et al. | 361/403 |
| 5,272,590 A | * | 12/1993 | Hernandez | 361/306.2 |
| 5,640,047 A | * | 6/1997 | Nakashima | 257/738 |
| 5,640,048 A | * | 6/1997 | Selna | 257/738 |
| 6,046,499 A | * | 4/2000 | Yano et al. | 257/712 |
| 6,084,295 A | * | 7/2000 | Horiuchi et al. | 257/690 |

* cited by examiner

*Primary Examiner*—Kamand Cuneo
*Assistant Examiner*—Joseé H. Alcala
(74) *Attorney, Agent, or Firm*—Peter F. Corless; Steven M. Jensen; Edwards & Angell, LLP.

(57) ABSTRACT

A BGA (Ball Grid Array) package is proposed, which is characterized by the provision of an interdigitated power/ground ring layout scheme. By this layout scheme, the power ring and the ground ring are each formed with a line portion and a plurality of toothed portions; with the toothed portions of the power ring being are interdigitated with the toothed portions of the ground ring. Moreover, the power/ground vias are all connected to the toothed portions of the power ring and the ground ring, thereby leaving the line portions of the power ring and the ground ring unoccupied by the power/ground vias, allowing the routability of power/ground wires to be higher than the prior art. Moreover, solder bask is formed in such a manner as to cover all the toothed portions of the ground ring, so that power wires can be prevented from being short-circuited to the ground ring due to sagging. Further, the toothed portions of the power ring and the ground ring are large in area, whereby two or more power vias or ground vias can be gathered together to increase the overall electrical performance, and whereby the packaged chip can be increased in heat-dissipation efficiency.

10 Claims, 5 Drawing Sheets

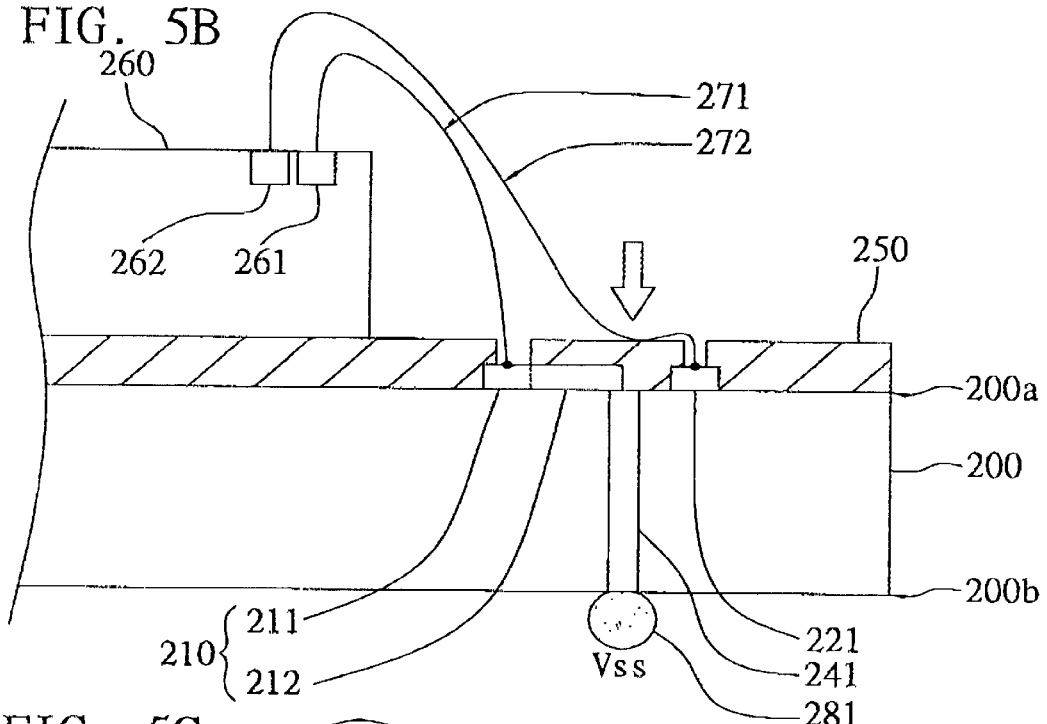
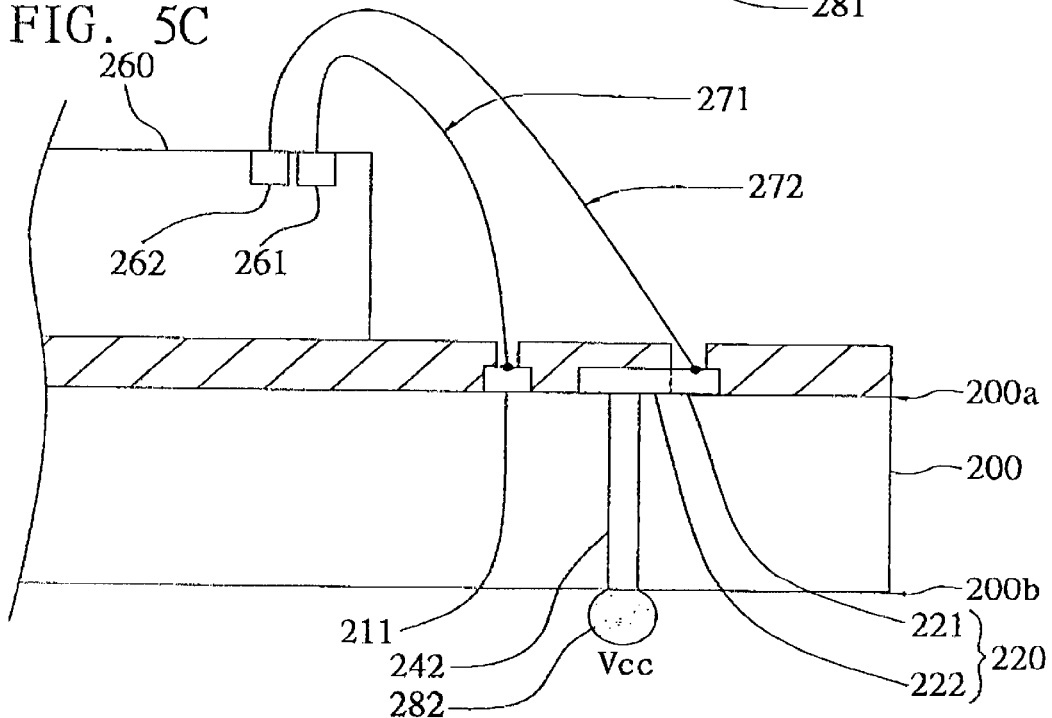

US 6,449,169 B1

BALL GRID ARRAY PACKAGE WITH INTERDIGITATED POWER RING AND GROUND RING

BACKGROUND OF THE INVENTION

1. Field of the Invention

This invention relates to semiconductor packaging technology, and more particularly, to a BGA (Ball Grid Array) package with interdigitated power ring and ground ring.

2. Description of Related Art

BGA (Ball Grid Array) is an advanced type of semiconductor packaging technology which is characterized in the use of a substrate whose front side is mounted with a semiconductor chip and whose back side is mounted with a grid array of solder balls. During SMT (Surface Mount Technology) process, the BGA package can be mechanically bonded and electrically coupled to an external printed circuit board (PCB) by means of these solder balls.

Typically, the BGA substrate is formed with a power ring and a ground ring on the front side thereof The power ring is a ring-shaped electrically-conductive trace surrounding the packaged chip and is used to deliver the power from the external PCB to the packaged chip during operation, and the ground ring is a ring-shaped electrically-conductive trace arranged alongside the power ring and is used to connect the ground pads of the packaged chip to grounding lines on the external PCB.

FIGS. 1A–1B show a typical BGA package with power ring and ground ring (note that FIGS. 1A–1B are simplified schematic diagrams showing only a small number of components; the actual BGA structure and circuit layout may be much more complex).

As shown, this BGA package includes: (a) a substrate 100 having A front side 100a and a back side 100b; (b) a ground ring 110 formed on the front side 100a of the substrate 100; (c) a power ring 120 formed alongside the ground ring 110; (d) a plurality of I/O pads 130 formed over the front side 100a of the substrate 100; (d) a plurality of vias (electrically-conductive through-holes) 141, 142, 143 penetrating the substrate 100, which include a subgroup of ground vias 141 each having an upper end connected to the ground ring 110 and a bottom end exposed on the back side 100b of the substrate 100; a subgroup of power vias 142 each having an upper end connected to the power ring 120 and a bottom end exposed on the back side 100b of the substrate 100; a subgroup of I/O vias 143 each having an upper end connected to one of the I/O pads 130 and a bottom end exposed on the back side 100b of the substrate 100; (e) a solder mask 150 formed over the front side 100a of the substrate 100 while exposing the ground ring 110, the power ring 120, and the I/O pads 130; (f) a semiconductor chip 160 having ground pads 161, power pads 162, and I/O pads 163, and which is mounted on the front side 100a of the substrate 100 within the area surrounded by the ground ring 110 and the power ring 120; (g) a set of bonding wires 170, including a subset of ground wires 171 for connecting the chip's ground pads 161 to the ground ring 110; a subset of power wires 172 for connecting the chip's power pads 162 to the power ring 120; and a subset of I/O wires 173 for connecting the chip's I/O pads 163 to the substrate's I/O pads 130; and (h) a ball grid array (an array of solder balls) 180 provided on the back side 100b of the substrate 100, which includes a subgroup of ground balls 181 bonded to the ground vias 141; a subgroup of power balls 182 bonded to the power vias 142; and a subgroup of I/O balls 183 bonded to the I/O vias 143. When this BGA package is mounted on an external PCB (not shown), it allows the ground balls 181, the power balls 182, and the I/O balls 183 to be coupled respectively to the PCB's $V_{CC}$ (system power), $V_{SS}$ (ground line) and I/O (signal input/output) lines.

Conventionally, the foregoing power/ground ring layout scheme on BGA package can be implemented in many various ways.

FIG. 2 is a schematic diagram showing a conventional power/ground ring layout scheme oh BGA package, which is disclosed in U.S. Pat. No. 5,686,699 entitled "SEMICONDUCTOR BOARD PROVIDING HIGH SIGNAL PIN UTILIZATION".

As shown, this power/ground ring layout scheme includes the layout of a ground ring 110' and a power ring 120' surrounding the packaged chip 160', which are both shaped in straight lines and directly connected to ground vias 141' and power vias 142'. Further, a plurality of ground wires 171' are connected from the chip's ground pads 161' to the ground ring 110', while a plurality of power wires 172' are connected from the chip's power pads 162' to the power ring 120'.

One drawback to the forgoing power/ground ring layout scheme, however, is that since those points on the ground ring 110' and the power ring 120' that are already connected to the ground vias 141' and the power vias 142' are unbondable areas for the power/ground wires 171', 172', it would reduce the routability of the power/ground wires 171', 172'. Therefore, the layout design for the power/ground wires 171', 172' would be difficult.

FIG. 3 shows a solution to the above-mentioned routability problem. As shown, this power/ground ring layout scheme includes the layout of a ground ring 110" and a power ring 120" surrounding the packaged chip 160", wherein the ground ring 110" is formed with a line portion 111" and a plurality of branched portions 112" extending out from the line portion 111" for connection to ground vias 141"; and in a similar manner, the power ring 120" is formed with a line portion 121" and a plurality of branched portions 122" extending out from the line portion 111" for connection to power vias 142". This power/ground ring layout scheme allows the power/ground vias 141", 142" to be located beyond the line portions 111", 121" of the ground ring 110" and the power ring 120", thereby allowing power/ground wires 171", 172" to be straight routed to the nearest points on the line portions 111", 121" of the ground ring 110" and the powder ring 120". Therefore, the power/ground ring layout scheme shown in FIG. 3 has a better routability than the prior art of FIG. 2, allowing the layout design work to be more convenient to implement.

The foregoing solution of FIG. 3, however, Us two drawbacks. First, since the provision of the branched portions 112", 122" of the ground ring 110" and the power ring 120" increases the length of the power/ground conductive path, it would undesirably degrade the electrical performance of the packaged/chip 160". Second, it would make the ground ring 110" and the power ring 120" farther separated from each other, which would additionally degrade the electrical performance of the packaged chip 160". Therefore, the power/ground ring layout scheme shown in FIG. 3 would undesirably cause the packaged chip 160" to have poor electrical performance during operation.

FIG. 4A shows a solution to the foregoing problem of degraded electrical performance, which is disclosed in the U.S. Pat. No. 5,726,860 entitled "METHOD AND APPARATUS TO REDUCE CAVITY SIZE AND THE BOND-

WIRE LENGTH IN THREE TIER PGA PACKAGE BY INTERDIGITATING THE VCC/VSS".

As shown, this power/ground ring layout scheme includes the layout of a ground ring 110''' and a power ring 120''' surrounding the packaged chip 160''', wherein the ground ring 110''' is formed with a line portion 111''' and a plurality of toothed portions 112''', and in a similar manner, the power ring 120''' is formed with a line portion 121''' and a plurality of toothed portions 122'''. To allow a reduced distance between the ground ring 110''' and the power ring 120''', the line portion 111''' of the ground ring 110''' is aligned substantially in parallel to the line portion 121''' of the power ring 120''', and the toothed portions 112''' of the ground ring 110''' are interdigitated with the toothed portions 122''' of the power ring 120'''.

One drawback to the forgoing power/ground ring layout scheme, however, as illustrated in FIG. 4B, is that those power wires 172''' that are routed overhead across the line portion 111''' of the ground ring 110''' would be easily short-circuited to the ground ring 110''' due to the sagging of these power wires 172''' against the line portion 111''' of the ground ring 110'''.

SUMMARY OF THE INVENTION

It is therefore an objective of this invention to provide, a BGA package with interdigitated power/ground ring layout scheme, which can help to increase the routability of power/ground wires.

It is another objective of this invention to provide a BGA package with interdigitated power/ground ring layout scheme, which allows a reduced distance between the power ring and the ground ring for retaining the electrical performance of the packaged chip.

It is still another objective of this invention to provide a BGA package with interdigitated power/ground ring layout scheme, which can prevent power wires from being short-circuited to the ground ring due to sagging against the ground ring.

It is still another objective of this invention to provide a BGA package with interdigitated power/ground ring layout scheme, which can help to increase the efficiency of heat dissipation from the packaged chip.

In accordance with the foregoing and other objectives, the invention proposes an BGA package with an improved power/ground ring layout scheme.

By the invention, the power ring and the ground ring are each formed with a line portion and a plurality of toothed portions; with the toothed portions of the power ring being are interdigitated with the toothed portions of the ground ring. The power/ground vias are all connected to the toothed portions of the power ring and the ground ring, thereby leaving the line portions of the power ring and the ground ring unoccupied by the power/ground vias. Moreover, solder mask is formed in such a manner as to cover all the toothed portions of the ground ring, so that power wires can be prevented from being short-circuited to the ground ring due to sagging. Further, the toothed portions of the power ring and the ground ring are large in area, whereby two or more power vias or ground vias can be gathered together to increase the overall electrical performance, and whereby the packaged chip can be increased in heat-dissipation efficiency.

BRIEF DESCRIPTION OF DRAWINGS

The invention can be more fully understood by reading the following detailed description of the preferred embodiments, with reference made to the accompanying drawings, wherein:

FIG. 5B shows a sectional view of the BGA package of FIG. 5A cutting through the line 5B—5B; and FIG. 5C shows a sectional view of the BGA package of FIG. 5A cutting through the line 5C—5C.

DETAILED DESCRIPTION OF PREFERRED EMBODIMENTS

Figure 1A:
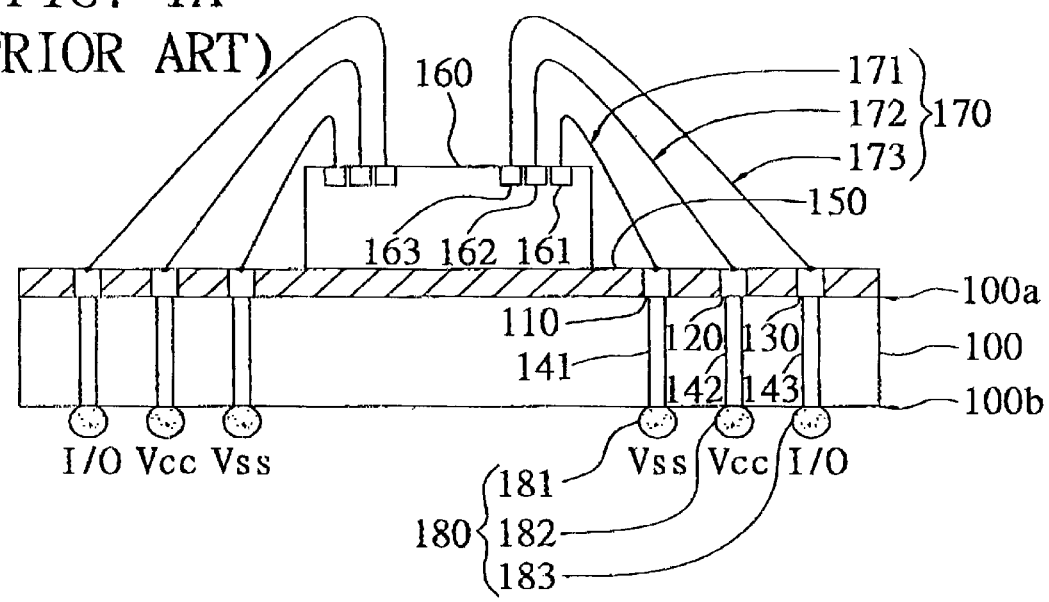
FIG. 1A (PRIOR ART) is a schematic sectional diagram showing the structure of a typical BGA package with power ring and ground ring.
Figure 1B:
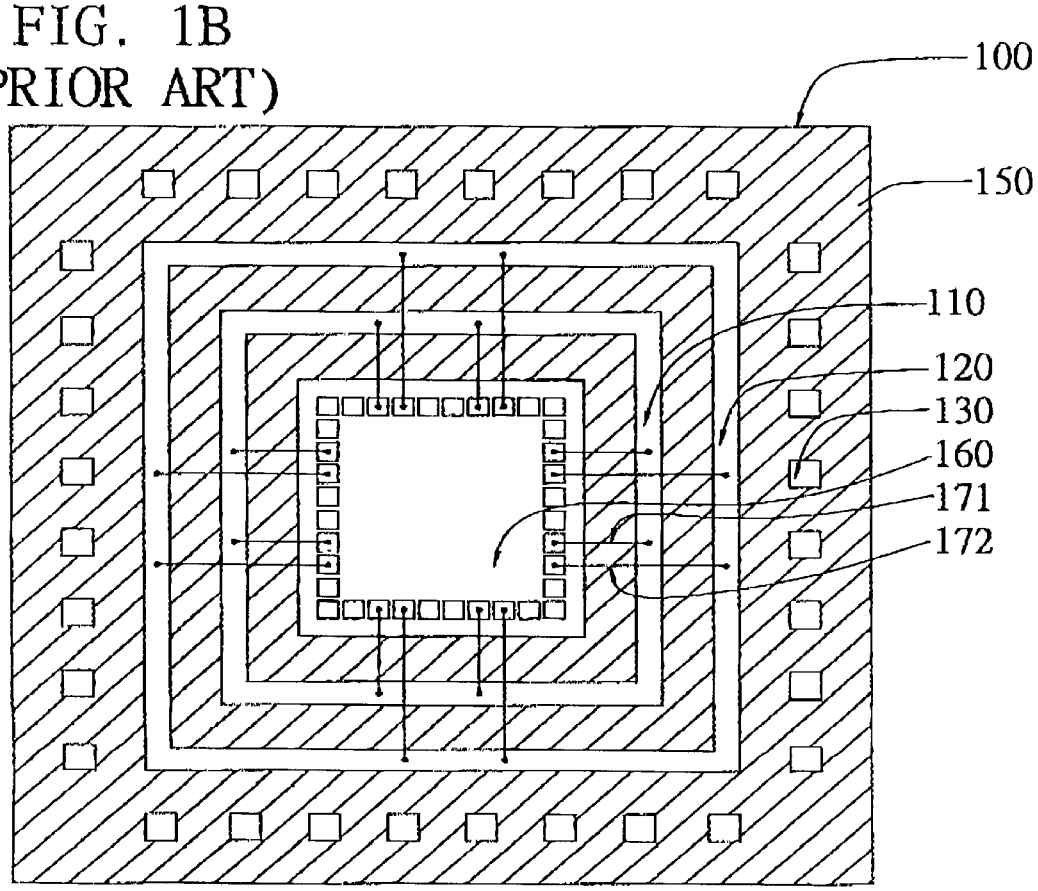
FIG. 1B (PRIOR ART) shows a top view of the BGA package of FIG. 1A.
Figure 2:
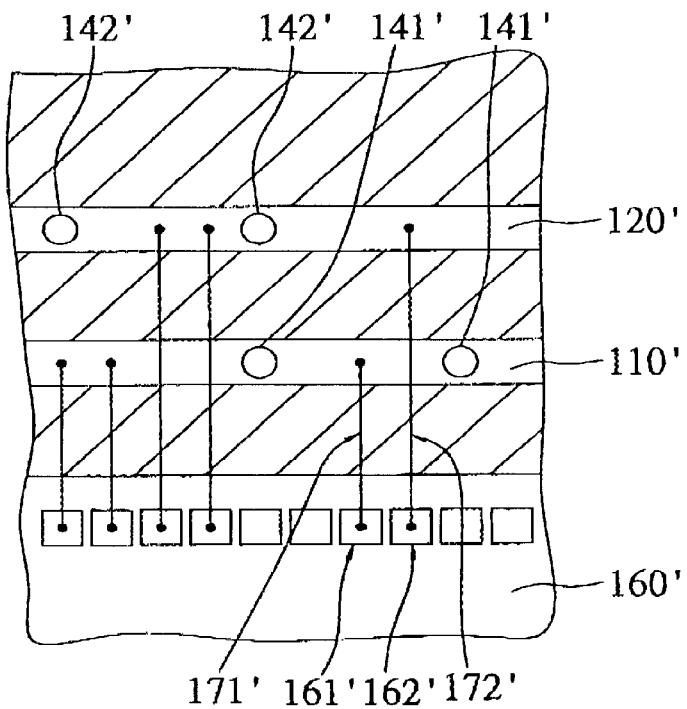
FIG. 2 (PRIOR ART) is a schematic diagram shown in top view, which is used to depict a first conventional power/ground ring layout scheme on BGA package.
Figure 3:
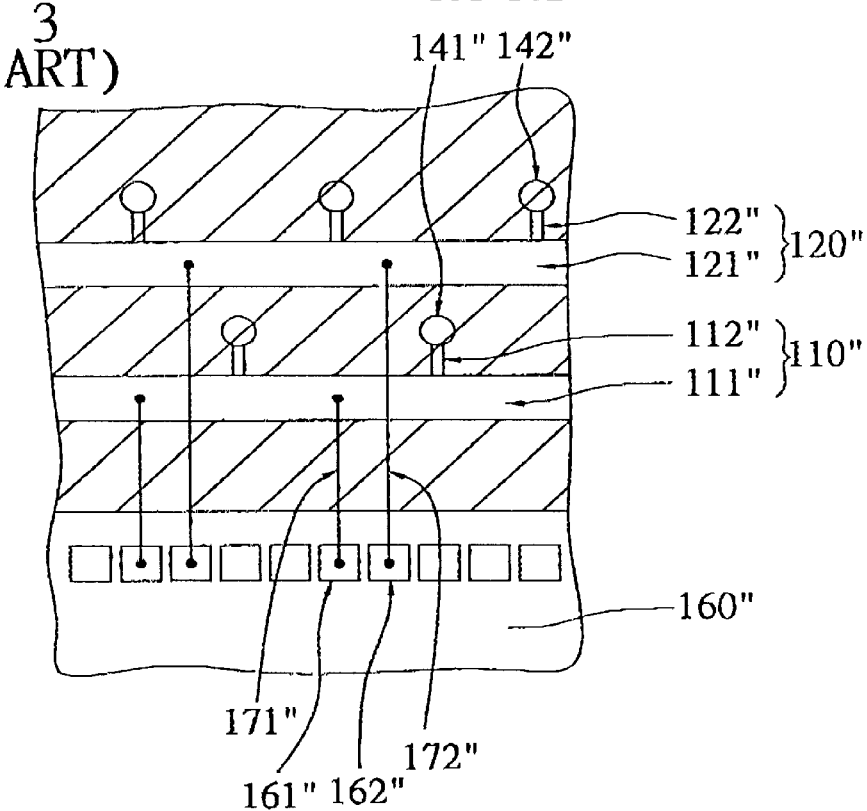
FIG. 3 (PRIOR ART) is a schematic diagram shown in top view, which is used to depict a second conventional power/ground ring layout scheme on BGA package.
Figure 4A:
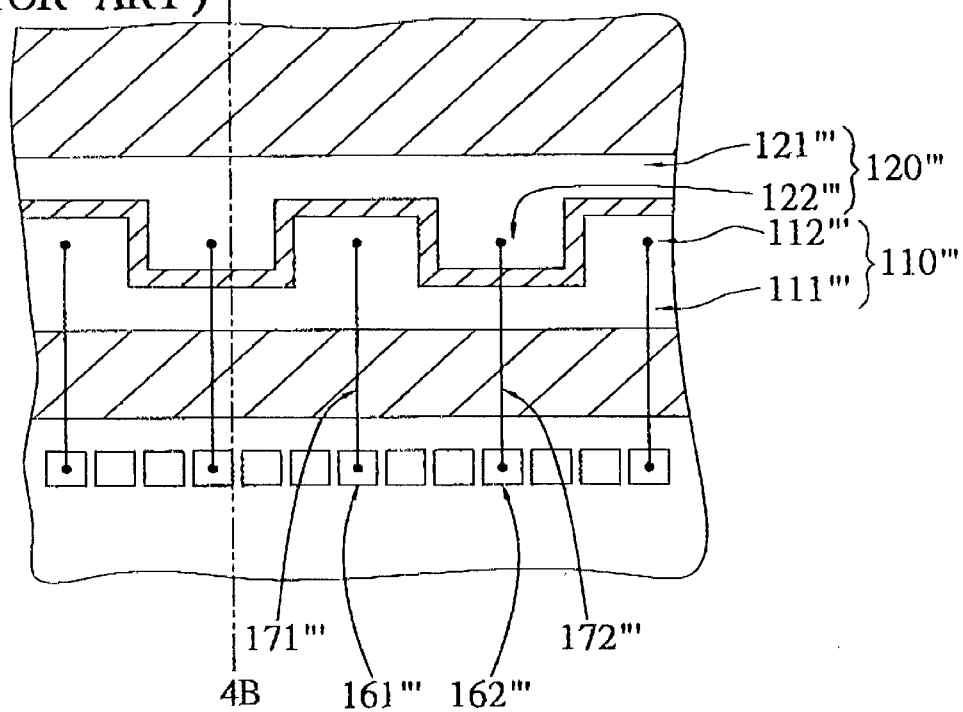
FIG. 4A (PRIOR ART) is a schematic diagram shown in top view, which is used to depict a third conventional power/ground ring layout scheme on BGA package.
Figure 4B:
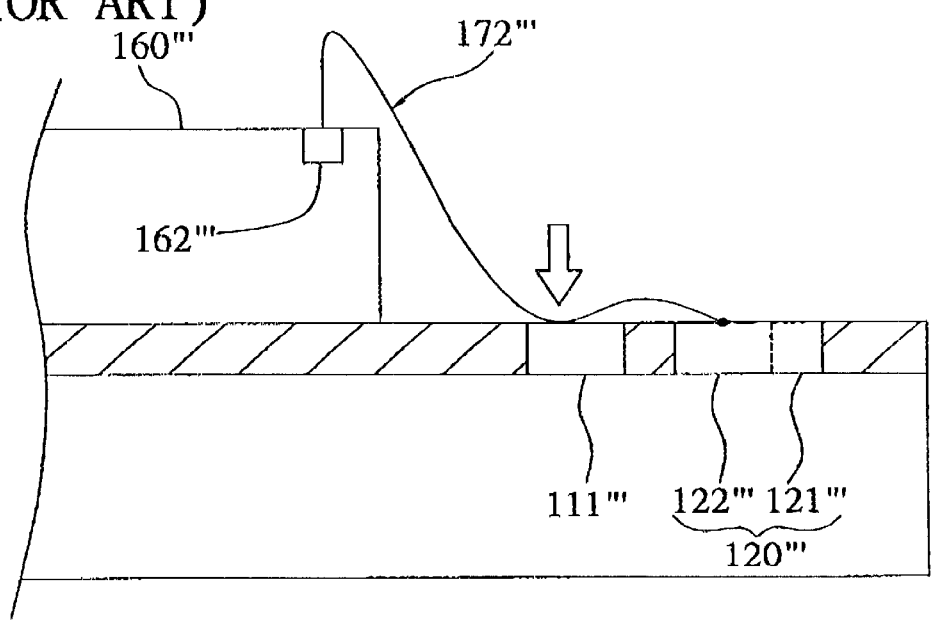
FIG. 4B (PRIOR ART) shows a sectional view of the BGA package of FIG. 4A cutting through the line 4B—4B, used to depict the cause of a short-circuit due to the sagging of a power wire against the ground ring.

A preferred embodiment of the BGA package with interdigitated power/ground ring layout scheme according to the invention is disclosed in full details in the following with reference to FIGS. 5A–5C (note that since the I/O related components, including I/O pads, I/O wires, I/O vias, and I/O balls, is not within the spirit and scope of the invention, these components are not shown in FIGS. 5A–5C for simplification of the drawings).

The BGA package according to the invention is constructed on a substrate 200 having a front side 200a and a back side 200b, wherein the front side 200a is used to mount a semiconductor chip 260 having a plurality of ground pads 261 and power pads 262.

Figure 5A:
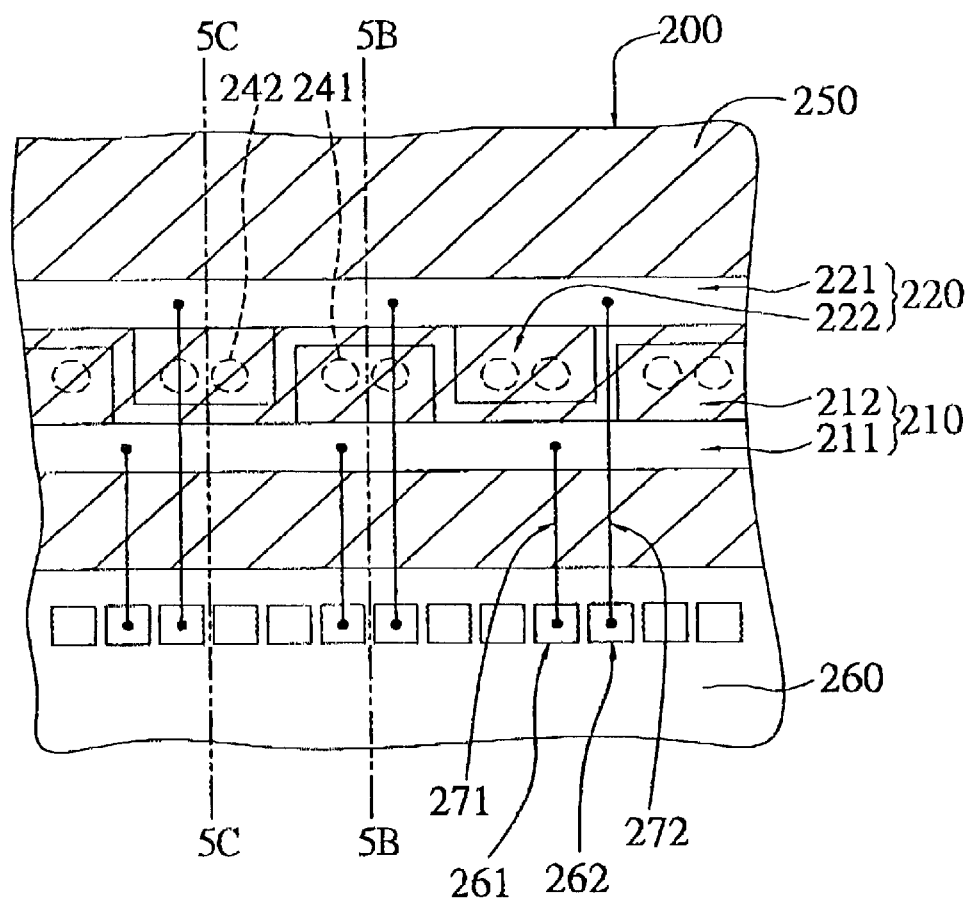
FIG. 5A is a schematic diagram used to depict a preferred embodiment of the BGA package with interdigitated power ring and ground ring according to the invention.

Referring to FIG. 5A, the power/ground ring layout scheme includes the layout of a ground ring 210 and a power ring 220 on the substrate 200; wherein the ground ring 210 is formed with a line portion 211 and a plurality of toothed portions 212; and in a similar manner, the power ring 220 is formed with a line portion 221 and a plurality of toothed portions 222. To allow a reduced layout area, the line portion 211 of the ground ring 210 is aligned substantially in parallel to the line portion 221 of the power ring 220; and the toothed portions 212 of the ground ring 210 are interdigitated with the toothed portions 222 of the power ring 220.

Further, a plurality of vias (electrically-conductive through-holes) 241, 242 are formed in the substrate 200, which include a subgroup of ground via 241 and a subgroup of power vias 242. It is a characteristic feature of the invention that the ground vias 241 are all connected to the toothed portions 212 of the ground ring 210; while the power vias 242 are all connected to the toothed portions 222 of the power ring 220. Since no vias are connected to the line portions 211, 221 of the ground ring 210 and the power ring 220, it allows any points on the line portions 211, 221 to-wire-bondable.

Moreover, the toothed portions 212 of the ground ring 210 are dimensioned large enough to allow two or more of the ground vias 241 to be connected thereto; and in a similar manner, the toothed portions 222 of the power ring 229 are dimensioned large enough to allow two or more of the power vias 242 to be connected thereto. This allows vias of the same type, i.e., ground vias or power vias, to be gathered together in close proximity and connected to the same toothed portions of the ground ring or the power ring, which can help to increase the electrical performance of the packaged chip 260.

During die-bonding process, the semiconductor chip 260 is mounted on the front side 200a of the substrate 200 within the area surrounded by the ground ring 210 and the power ring 220. Next, a wire-bonding process is performed to bond a set of bonding wires 270 to the semiconductor chip 260, including a subset of ground wires 271 for connecting the ground pads 261 of the semiconductor chip 260 to the line portion 211 of the ground ring 210; and a subset of power wires 272 for connecting the power pads 262 of the same to the line portion 221 of the power ring 220. By the invention, since all the ground/power vias 241, 242 are connected to the toothed portions 212, 222 of the ground ring 210 and the power ring 220, it allows any points on the line portion 211, 221 to be wire-bondable. In other words, the routing of the ground/power wires 271, 272 is unrestricted by the ground/power vias 241, 242; and therefore, the routability of the ground/power wires 271, 272 is higher than the prior art.

As illustrated in FIG. 5B, it is another characteristic feature of the invention that a solder mask 250 is formed over the front side 200a of the substrate 200 in such a manner as to cover the toothed portions 212 the ground ring 210 while exposing the line portions 211, 221 of the ground ring 210 and the power ring 220.

Due to the provision of the solder mask 250 covering the toothed portions 212 of the ground ring 210, it can be seen from FIG. 5B that the power wires 272 that are routed overhead across the toothed portions 212 of the ground ring 210 can be prevented from being short-circuited to the ground ring 210 due to sagging.

Finally, a grid array of solder balls 281, 282 are implanted on the back side 200b of the substrate 200, which includes a subgroup of ground balls 281 bonded to the ground vias. 241, and a subgroup of power balls 282 bonded to the power vias 242. This completes the fabrication of the BGA package.

In conclusion, the invention provides a BGA package with an interdigitated power/ground ring layout scheme. Compared to the prior art, the BGA package according to the invention has the following advantages.

First, since the power/ground vias are all connected to the toothed portions of the power ring and the ground ring, it allows the power/ground wires to be bonded to any suitable points on the line portions of the power ring and the ground ring. Therefore, the routability of the power/ground wires is higher than the prior art.

Second, due to the provision of the solder mask covering the toothed portions of the ground ring, it can prevent the power wires that are routed overhead across the toothed portions of the ground ring from being short-circuited to the same due to sagging.

Third, since the toothed portions of the power ring and the ground ring are larger in area than the prior art, it allows vias of the same type, i.e., around vias or power vias, to be gathered together in close proximity and connected to the same toothed portions of the ground ring or the power ring, which can help to increase the electrical performance of the packaged chip. In addition, the toothed portions being provided in larger areas can help to increase the efficiency of heat dissipation from the power ring and the ground ring thereby effectively increasing the overall heat-dissipation efficiency o the packaged chip.

Fourth, since the power ring and the ground ring are closely arranged to each other due to the interdigitated arrangement of their toothed portions, it can help to increase the electrical performance of the packaged chip.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A BGA Packages which comprises:
    (a) a substrate having a front side and a back side;
    (b) a first electrically-conductive ring formed over the front side of the substrate;
        the first electrically-conductive ring being formed with a line portion and a plurality of toothed portions along the line portion thereof;
    (c) a second electrically-conductive ring arranged alongside the first electrically-conductive ring;
        the second electrically-conductive ring being formed with a line portion and a plurality of toothed portions along the line portion thereof and interdigitated with the toothed portions of the first electrically-conductive ring;
    (d) a plurality of vias penetrating through the substrate, including:
        a subgroup of first vias which are connected to the toothed portions of the first electrically-conductive ring; and
        a subgroup of second vias which we connected to the toothed portions of the second electrically-conductive ring;
    (e) a solder mask formed over the front side of the substrate for electrically masking the first electrically-conductive ring and the second electrically-conductive ring;
    (f) a semiconductor chip mounted over the front side of the substrate the semiconductor chip having a plurality of first pads and second pads; and
    (g) a set of bonding wires, including:
        a subset of first wires for connecting the first pads of the semiconductor chip to the line portion of the first electrically-conductive ring, and
        a subset of second wires for connecting the second pads of the semiconductor chip to the line portion of the second electrically-conductive ring.

2. The BGA package of claim 1, wherein
the first electrically-conducive ring is a ground ring; and
the second electrically-conductive ring is a power ring.

3. The BGA package of claim 1, wherein
the first electrically-conductive ring is a power ring; and
the second electrically-conductive ring is a ground ring.

4. The BGA package of claim 1, wherein
the toothed portions of the first electrically-conductive ring is dimensioned to an extent that allows two or more of the first vias to be connected thereto; and the toothed portions of the second electrically-conductive ring is dimensioned to an extent that allows two or more of the second vias to be connected thereto.

5. The BGA package of claim 1, wherein the solder mask is formed in such a manner as to cover the toothed portions of the first electrically-conductive ring for preventing the second wires from being short-circuited to the first electrically-conductive ring.

6. A BGA package, which comprises:

(a) a substrate having a front side and a back side;

(b) a ground ring firmed over the front side of the substrate;
the ground ring being formed with a line portion and a plurality of toothed portions along the line portion thereof;

(c) a power ring arranged alongside the ground ring;
the power ring being formed with a line portion and a plurality of toothed portions along the line portion thereof and interdigitated with the toothed portions of the ground ring;

(d) a plurality of vias penetrating through the substrate, including:
a subgroup of ground vias which are connected to the toothed portions of the ground ring; and
a subgroup of power vias which are connected to the toothed portions of the power ring;

(e) a solder mask formed over the front side of the substrate for electrically masking the ground ring and the power ring;

(f) a semiconductor chip mounted over the front side of the substrate; the semiconductor chip having a plurality of ground pads and power pads; and (g) a set of bonding wires, including:
a subset of ground wires for connecting the ground pads of the semiconductor chip to the line portion of the ground ring; and
a subset of power wires for connecting the power pads of the semiconductor chip to the line portion of the power ring.

7. The BGA package of claim 6, wherein
the toothed portions of the ground ring is dimensioned to an extent that allows two or more of the ground vias to be connected thereto; and
the tooted portions of the power ring is dimensioned to an extent that allows two or more of the power vias to be connected thereto.

8. The BGA package of claim 6, wherein the solder mask is formed in such a manner as to cover the toothed portions of the ground ring for preventing the power wires from being short-circuited to the ground ring.

9. A BOA package, which comprises:

(a) a substrate having a front side and a back side;

(b) a ground ring formed over the front side of the substrate;
the ground ring being formed with a line portion and a plurality of toothed portions along the line portion thereof;

(c) a power ring arranged alongside the ground ring;
the power ring being formed with a line portion and a plurality of toothed portions along the line portion thereof and interdigitated with the toothed portions of the ground ring;

(d) a plurality of vias penetrating through the substrate, including:
a subgroup of ground vias which are connected to the toothed portions of the ground ring; and
a subgroup of power vias which are connected to the toothed portions of the power ring;

(e) a solder mask formed over the front side of the substrate, in such a manner as to cover the toothed portions of the ground ring;

(f) a semiconductor chip mounted over the front side of the substrate, the semiconductor chip having a plurality of ground pads and power pads; and (g) a set of bonding wires, including:
a subset of ground wires for connecting the ground pads of the semiconductor chip to the line portion of the ground ring; and
a subset of power wires for connecting the power pads of the semiconductor chip to the line portion of the power ring.

10. The BGA package of claim 9, wherein
the toothed portions of the ground ring is dimensioned to an extent that allows two or more of the ground vias to be connected thereto; and
the toothed portions of the power ring is dimensioned to an extent that allows two or more of the power vias to be connected thereto.

* * * * *